United States Patent [19]

Hayes et al.

[11] 3,713,831

[45] Jan. 30, 1973

[54] COATING COMPOSITION COMPRISING PHOTOACTIVATOR AND FILM-FORMING ORGANIC MATERIAL FOR POWDER DEVELOPMENT

[75] Inventors: Lester P. Hayes; Rexford W. Jones, both of Decatur, Ill.; William B. Thompson, Columbus, Ohio

[73] Assignee: A. E. Staley Manufacturing Company, Decatur, Ill.

[22] Filed: Aug. 22, 1969

[21] Appl. No.: 852,914

Related U.S. Application Data

[63] Continuation-in-part of Ser. No. 796,847, Feb. 5, 1969, Pat. No. 3,637,385.

[52] U.S. Cl. ............................96/88, 96/48, 96/115

[51] Int. Cl. ..............................................G03c 1/00

[58] Field of Search ................96/88, 115, 115 P, 1.1

[56] References Cited

UNITED STATES PATENTS

| | | | |
|---|---|---|---|
| 940,808 | 11/1909 | Hartnett | 96/115 |
| 1,587,271 | 6/1926 | Beebe et al. | 96/115 |
| 3,307,941 | 3/1967 | Gundlach | 96/115 |
| 3,318,698 | 5/1967 | Schwertz | 96/1.1 |

*Primary Examiner*—Norman G. Torchin
*Assistant Examiner*—Won H. Louie, Jr.
*Attorney*—William H. Magidson

[57] ABSTRACT

Storage stable coating compositions suitable for the preparation of solid, light-sensitive organic layers utilizable in deformation imaging comprising a liquid vehicle, a film forming organic material and a photoactivator capable of producing free radicals.

35 Claims, No Drawings

COATING COMPOSITION COMPRISING PHOTOACTIVATOR AND FILM-FORMING ORGANIC MATERIAL FOR POWDER DEVELOPMENT

DISCLOSURE OF THE INVENTION

This application is a continuation-in-part of application Ser. No. 796,847 filed Feb. 5, 1969 now U.S. Pat. No. 3,637,385.

This invention relates to storage stable coating compositions suitable for the preparation of solid, light-sensitive organic layers utilizable in deformation imaging comprising a liquid vehicle, a film forming organic material and a photoactivator capable of producing free radicals. More particularly, this invention is directed to storage stable coating compositions suitable for the preparation of solid light-sensitive organic layers utilizable in deformation imaging comprising a liquid vehicle, a film forming organic material containing no terminal conjugated ethylenic unsaturation and a photoactivator capable of producing free radicals selected from the group consisting of acyloins and vicinal diketones.

In the description that follows, the phrase "powder receptive solid light-sensitive organic layer" is used to describe an organic layer which is capable of developing a predetermined contrast or reflection density ($R_d$) upon exposure to actinic light and embedment of black powder particles of a predetermined size in a single stratum at the surface of said organic layer. The $R_d$ of a light-sensitive layer is a photometric measurement of the difference in degree of blackness of undeveloped areas and black powder developed areas. The terms "physically embedded" or "physical force" are used to indicate that the powder particle is subjected to an external force other than, or in addition to, either electrostatic force or gravitational force resulting in dusting or sprinkling powder particles on a substrate. The terms "-mechanically embedded" or "mechanical force" are used to indicate that the powder particle is subjected to a manual or machine force, such as a lateral to-and-fro or circular rubbing or scrubbing action. The term "embedded" is used to indicate that the powder particle displaces at least a portion of the light-sensitive layer and is held in the depression so created, i.e., at least a portion of each particle is below the surface of the light-sensitive layer. The term "vehicle" is used to refer to liquids used as solvents or suspending agents suitable for depositing a solid, light-sensitive organic layer on a substrate.

In our copending parent application Ser. No. 796,847 filed Feb. 5, 1969, now U.S. Pat. No. 3,637,385, which is hereby incorporated by reference, we have disclosed a process of forming deformation images wherein the deformation image is developed by embedding particles of predetermined size into a stratum at the surface of a powder receptive solid, light-sensitive organic layer. While numerous techniques can be employed to prepare solid, light-sensitive organic layers, it is preferred to apply these coatings to a substrate from a liquid vehicle. The principle object of this invention is to provide storage stable coating compositions suitable for the preparation of solid, light-sensitive organic layers utilizable in deformation imaging. Other objects will appear hereinafter.

The objects of this invention have been attained by compounding a film forming organic material and a photoactivator capable of producing free radicals in a liquid vehicle. The coating compositions of this invention are storage stable and, by varying the concentration of film forming organic material and photoactivator, it is possible to produce light-sensitive layers of predetermined thickness having high powder receptivity and excellent speed.

The coating compositions of this invention must be capable of depositing a solid, light-sensitive organic layer capable of developing a $R_d$ of 0.2 to 2.2, preferably 0.4 to 2.0, using a suitable black developing powder under the conditions of development. The powder-receptive areas of the layer (unexposed areas of a positive-acting, light-sensitive material or the exposed areas of a negative-acting, light-sensitive material) must have a softness such that suitable particles can be embedded into a stratum at the surface of the light-sensitive layer by mild physical forces. However, the layer should be sufficiently hard and non-sticky that film transparencies can be pressed against the surface, as in vacuum frame, without the surfaces sticking together or being damaged even when heated slightly under high intensity light radiation. The film should also have a degree of toughness so that it maintains its integrity during development. If the $R_d$ of the light-sensitive layer is below about 0.2, the light-sensitive layer is too hard to accept a suitable concentration of powder particles. On the other hand, if the $R_d$ is above about 2.2, the light-sensitive layer is so soft that it is difficult to maintain film integrity during physical development and the layer tends to adhere to transparencies precluding the use of vacuum frame exposure equipment. Further, if the $R_d$ is above 2.2, the light-sensitive layer is so soft that more than one layer of powder particles may be deposited with attendant loss of continuous-tone quality and image fidelity and the layer may be displaced by mechanical forces resulting in distortion or destruction of the image. Accordingly, for use in this invention, the coating composition must be capable of depositing a light-sensitive layer capable of developing a $R_d$ within the range of 0.2 to 2.2, or preferably 0.4 to 2.0, using a suitable black developing powder under the conditions of development.

The $R_d$ of a positive acting light-sensitive layer, which is called $R_{dp}$, is a photometric measurement of the reflection density of a black-powder developed light-sensitive layer after a positive-acting, light-sensitive layer has been exposed to sufficient actinic radiation to convert the exposed areas (or most exposed areas, when a continuous-tone transparency is used) into a substantially powder-non-receptive state (clear the background). The $R_d$ of a negative acting light-sensitive layer, which is called $R_{dn}$, is a photometric measurement of the reflection density of a black powder developed area, after a negative-acting, light-sensitive layer has been exposed to sufficient actinic radiation to convert the exposed area into a powder-receptive area.

In somewhat greater detail, the reflection density of a solid, positive-acting, light-sensitive layer ($R_{dp}$), is determined by coating the light-sensitive layer on a white substrate, exposing the light-sensitive layer to sufficient actinic radiation image-wise to clear the background of the solid positive-acting, light-sensitive layer, applying a black powder (prepared from 77 percent Pliolite VTL and 23 percent Neo Spectra carbon black in the manner described below) to the exposed layer, physically embedding said black powder under the conditions of development as a monolayer in a stratum at the surface of said light-sensitive layer and removing the non-embedded particles from said light-sensitive layer. The developed organic layer containing black powder embedded image areas and substantially powder free non-image areas is placed in a standard photometer having a scale reading from 0 to 100 percent reflection of incident light or an equivalent density scale, such as a Model 500 A photometer of the Photovolt Corporation. The instrument is zeroed (0 density; 100 percent reflectance) on a powder free non-image area of the light-sensitive organic layer and an average $R_d$ reading is determined from the powder developed area of line and half-tone images. With continuous-tone images, the $R_d$ reading is determined on the blackest powder developed area. The reflection density is a measure of the degree of blackness of the developed surface which is relatable to the concentration of particles per unit area. The reflection density of a solid, negative-acting light-sensitive layer ($R_{dn}$) is determined in the same manner except that the negative-acting light-sensitive layer is exposed to sufficient actinic radiation to convert the exposed area into a powder receptive area. If the $R_d$ under the conditions of development is between 0.2 (63.1 percent reflectance) and 2.2 (0.63 percent reflectance), or preferably between 0.4 (39.8 percent reflectance) and 2.0 (1.0 percent reflectance), the solid, light-sensitive organic material deposited in a layer is suitable for use in this invention.

Although the $R_d$ of all light-sensitive layers is determined by using the aforesaid black developing powder and a white substrate, the $R_d$ is only a measure of the suitability of a coating composition for use in preparing light-sensitive organic layers.

Since the $R_d$ of any light-sensitive layer is dependent on numerous factors other than the chemical constitution of the light-sensitive layer, the light-sensitive layer is best defined in terms of its $R_d$ under the development conditions of intended use. The deposited positive-acting solid, light-sensitive organic layers useful in this invention must be powder receptive in the sense that the aforesaid black developing powder can be embedded as a mono-particle layer into a stratum at the surface of the unexposed layer to yield a $R_{dp}$ of 0.2 to 2.2 (0.4 to 2.0 preferably) under the predetermined conditions of development and light-sensitive in the sense that upon exposure to actinic radiation the most exposed areas can be converted into the non-particle receptive state (background cleared) under the predetermined conditions of development. In other words, the positive-acting, light-sensitive layer must contain a certain inherent powder receptivity and light-sensitivity. The positive-acting, light-sensitive layers are apparently converted into the powder-non-receptive state by a light-catalyzed hardening action, such as photopolymerization, photocrosslinking, photooxidation, etc. Some of these photohardening reactions are dependent on the presence of oxygen, such as the photooxidation of internally ethylenically unsaturated acids and esters while others are inhibited by the presence of oxygen, such as those based on the photopolymerization of vinylidene or polyvinylidene monomers alone or together with polymeric materials. The latter require special precautions, such as storage in oxygen-free atmosphere or oxygen-impermeable cover sheets. For this reason, it is preferable to use solid, positive-acting, film-forming, organic materials containing no terminal ethylenic unsaturation.

The positive-acting coating compositions of this invention comprise a liquid vehicle, a film-forming organic material in its naturally occurring or manufactured form, a photoactivator or photoactivators for adjusting the sensitivity to actinic radiation and, in some cases, plasticizers for adjusting powder receptivity. Suitable positive-acting, film-forming organic materials, which are not inhibited by oxygen, include internally ethylenically unsaturated acids, such as abietic acid, rosin acids, partially hydrogenated rosin acids, such as those sold under the name Staybelite resin, etc.; esters of internally ethylenically unsaturated acids, methylol amides of maleated oils such as described in application Ser. No. 643,367 filed June 5, 1967, now abandoned, phosphatides of the class described in application Ser. No. 796,841 filed on Feb. 5, 1969 now U.S. Pat. No. 3,585,031 in the name of Hayes, such as soybean lecithin, partially hydrogenated lecithin, diliolenyl-alpha-lecithin, etc., partially hydrogenated rosin acid esters, such as those sold under the name Staybelite esters, rosin modified alkyds, etc.; polymers of ethylenically unsaturated monomers, such as vinyltoluene-alpha methyl styrene copolymers, polyvinyl cinnamate, polyethyl methacrylate, vinyl acetate-vinyl stearate copolymers, polyvinyl pyrrolidone, etc.; coal tar resins, such as coumarone-indene resins, etc.; halogenated hydrocarbons, such as chlorinated waxes, chlorinated polyethylene, etc. Positive acting, light-sensitive film-formers, which are inhibited by oxygen include mixtures of polymers, such as polyethylene terephthalate/sebacate or cellulose acetate or acetate/butyrate, with polyunsaturated vinylidene monomers, such as ethylene glycol diacrylate or dimethacrylate, tetraethylene glycol diacrylate or dimethacrylate, etc.

The film-forming organic materials can be used in a concentration of about 0.1 to 50 grams per 100 ml. of liquid vehicle. The total concentration of film-forming organic material and other solids in the coating composition must be sufficient to deposit a reasonably smooth, homogeneous layer on a substrate of from about 0.1 to 40 microns thick. As pointed out in our parent application, if the light-sensitive layer is less than 0.1 micron, or the developing powder diameter is more than 25 times layer thickness, the light-sensitive layer does not hold powder with the tenacity necessary to form a permanent record. In general, as layer thickness increases, the light-sensitive layer is capable of holding larger particles. However, as the light-sensitive layer thickness increases, it becomes increasingly difficult to maintain film integrity during development. Accordingly, the solids in the coating composition must be sufficient to form a light-sensitive layer of from 0.1 to 40 microns, preferably from 0.4 to 10 microns, with 0.5 to 2.5 microns being best.

The total concentration of film-former and other solids necessary to form a light-sensitive layer of a predetermined thickness is dependent upon the nature of the substrate and the film former employed. For example, 5 micron films can be formed from coating compositions containing about 3 grams Staybelite Ester or Resin per 100 ml. vehicle or 20 grams lecithin per 100 ml. vehicle.

The coating compositions of this invention contain a photoactivator or photoactivators capable of producing free radicals, which catalyze the light-sensitive reaction and reduce the amount of photons necessary to yield the desired physical change in the deposited light-sensitive layers. For example, the near ultraviolet light sensitivity of soybean lecithin layers can be increased by a factor of 2,000 by the addition of a small concentration of ferric chloride. Whereas it may take eight minutes to clear the background of a light-sensitive lecithin element devoid of photoactivators using near ultraviolet radiation, lecithin elements containing from about 1–15 percent by weight ferric chloride based on the weight of the lecithin are so light-sensitive that they must be handled under yellow safety lights much like silver halide emulsions. The ferric chloride-photoactivated lecithin is about 10 times slower than silver halide printing papers but faster than commercial diazo material. Ferric chloride also advantageously increases the toughness and integrity of phosphatide layers.

Other suitable photoactivators capable of producing free-radicals include benzil, benzoin, Michlers ketone, diacetyl, phenanthraquinone, p-dimethylaminobenzoin, 7,8-benzoflavone, trinitrofluorenone, desoxybenzoin, 2,3-pentanedione, dibenzylketone, nitroisatin, di(6-dimethylamino-3-pyradil)methane, metal napthanates, N-methyl-N-phenylbenzylamine, pyridil, 5-7 dicloroisatin, azodiisobutyronitrile, trinitroanisole, chlorophyll, isatin, bromoisatin, etc. These compounds can be used in a concentration of 0.001 to 2 times the weight of the film-forming organic material (0.1–200 percent the weight of film former). As in most catalytic systems, the best photoactivator and optimum concentrations thereof is dependent upon the film-forming organic material. Some photoactivators respond better with one type of film former and may be useful over rather narrow concentration ranges whereas others are useful with substantially all film-formers in wide concentration ranges.

The acyloin and vicinal diketone photoactivators, particularly benzil and benzoin, are preferred. Benzoin and benzil are effective over wide concentration ranges with substantially all film-forming light-sensitive organic materials. Although slightly inferior to ferric chloride as photoactivators for lecithin, they are capable of increasing the light-sensitivity of the ethanol-insoluble fraction of lecithin to nearly the level of ferric chloride-sensitized lecithin. The acyloin and vicinal diketones, particularly benzoin and benzil, have the additional advantage that they have a plasticizing or softening effect on film-forming light-sensitive layers, thereby increasing the powder receptivity of the light-sensitive layers. When employed as photoactivators, the acyloin and vicinal diketones should preferably comprise at least 1 percent by weight of the film-forming organic material (.01 times the film former weight).

Dyes, optical brighteners and light absorbers can be, and preferably are, used in conjunction with the aforesaid free-radical producing photoactivators (primary photoactivators) to increase the light-sensitivity of the light-sensitive layers of this invention by converting the light rays into light rays of longer lengths. For convenience, these secondary photoactivators (dyes, optical brighteners and light absorbers) are called "superphotoactivators." Suitable dyes, optical brighteners and light absorbers include 4-methyl-7-dimethylaminocoumarin, Calcofluor yellow HEB (preparation described in U.S. Pat. No. 2,415,373), Calcofluor white SB super 30080, Calcofluor, Uvitex W conc., Uvitex TXS conc., Uvitex RS (described in Textil-Rundschau 8 [1953], 339), Uvitex WGS conc., Uvitex K, Uvitex CF conc., Uvitex W (described in Textil-Rundschau 8, [1953], 340) Aclarat 8678, Blancophor OS, Tenopol UNPL, MDAC S-8844, Uvinul 400, Thilflavin TGN conc., Aniline yellow — S (low conc.), Seto flavine T 5506-140, Auramine O, Calcozine yellow OX, Calcofluor RW, Calcofluor GAC, Acetosol yellow 2 RLS-PHF, Eosine bluish, Chinoline yellow — P conc., Ceniline yellow S (high conc.), Anthracene blue violet fluorescence, Calcofluor white MR, Tenopol PCR, Uvitex GS, Acid-yellow-T-supra, Acetosol yellow 5 GLS, Calcocid OR, Y. Ex. Conc., diphenyl brilliant flavine 7 GFF, Resoflorm fluorescent yel. 3 GPI, Eosin yellowish Thiazole fluorescor G, Pyrazalone organe YB-3 and National FD&C yellow. Individual superphotoactivators may respond better with one type of light-sensitive organic film-former and photoactivator than with others. Further, some photoactivators function better with certain classes of brighteners, dyes and light absorbers. For the most part, the most advantageous combinations of these materials and proportions can be determined by simple experimentation.

The preferred superphotoactivators are the secondary and tertiary aminocoumarins described in U. S. Pat. No. 2,610,152, which is hereby incorporated by reference. The 4-methyl-7-dimethylaminocoumarin has been particularly effective when used with the preferred acyloin and vicinal diketone primary photoactivators.

As indicated above, plasticizers can be used to impart optimum powder receptivity to the light-sensitive layer. With the exception of lecithin, most of the film-forming light-sensitive organic materials useful in this invention are not powder-receptive at room temperature but are powder-receptive above room temperature. Accordingly, it is desirable to add sufficient plasticizer, preferably an acyloin or vicinal diketone photoactivator, to impart room temperature (15° to 30° C.) or ambient temperature powder receptivity to the light-sensitive layers and/or broaden the $R_{dp}$ range of the light-sensitive layers. Plasticizers of the preferred type are particularly useful in continuous tone reproduction systems, where the light-sensitive layer must have a $R_{dp}$ of at least 0.5 and preferably 0.7–2.0. If the $R_{dp}$ is less than 0.5, the developed image lacks the tonal contrast necessary for aesthetically pleasing continuous tone reproductions.

While various softening agents, such as dimethyl siloxanes, glycerol, vegetable oils, etc. can be used as plasticizers, the acyloins and vicinal diketones (benzil and benzoin) are preferred since, as pointed out above, these materials have the additional advantage that they increase the light-sensitivity of the film forming organic materials. As plasticizer-photoactivators, these materials are preferably used in a concentration of about 5 to 80 percent by weight of the film-forming solid organic material or in a concentration sufficient to impart a room temperature $R_d$ of at least 0.4 to the deposited layer.

The preferred positive-acting light-sensitive film formers containing no conjugated terminal ethylenic unsaturation include the esters and acids of internally ethylenically unsaturated acids, particularly the phosphatides, rosin acids, partially hydrogenated rosin acids, rosin esters and the partially hydrogenated rosin esters. These materials, when compounded with suitable photoactivators, preferably acyloins or vicinal diketones together with superphotoactivators, or ferric chloride in the case of lecithin, require less than 2 minutes exposure to a sun lamp to clear the background of light-sensitive layers and yield excellent continuous tone reproductions having a $R_{dp}$ of at least 0.5 as well as line image and half-tone reproductions. For optimum results, the phosphatides should comprise about 2 to 20 grams per 100 ml. of vehicle and the rosin acids, rosin esters, partially hydrogenated rosin esters and acids should comprise about 0.4 to 3 gram per 100 ml. of vehicle.

The vehicles suitable for depositing light-sensitive layers of predetermined thickness to a substrate include hydrocarbons, such as hexane, heptane, toluene, benzene, etc.; halogenated hydrocarbon, such as chloroform, carbon tetrachloride, 1,1,1-trichlorethane, trichloroethylene, etc.; alcohols, such as ethanol, methanol, propanol, etc.; ketones, such as acetone, methyl ethyl ketone, etc. The hydrocarbon and halohydrocarbons, which are excellent solvents for the preferred positive-acting, light-sensitive film formers containing no terminal conjugated ethylenic unsaturation, are the preferred vehicles because of their high volatility and low cost. Typically, solutions prepared with these vehicles can be applied to a substrate and air dried to a continuous clear film in less than one minute. In general, the halohydrocarbons have the advantages that they are non-flammable and can be used without danger of flash fires. However, many of these, such as chloroform and carbon tetrachloride, must be handled with care due to the toxicity of their vapors. Of all these solvents, 1,1,1-trichloroethane is preferred because it has low toxicity, is non-flammable, low cost and has high volatility. When using 1,1,1-trichloroethane as the vehicle, it is preferable to use benzil rather than benzoin since benzil is must more soluble in 1,1,1-trichloroethane. Usually benzoin is dissolved in acetone before addition to 1,1,1-trichloroethane in order to obtain optimum compatibility.

The coating compositions of this invention can be applied to a suitable substrate, by draw down, spray, roller coating or air knife, flow, dip or whirler coating, curtain coating, etc.

The following examples are merely illustrative and should not be construed as limiting the scope of the invention.

EXAMPLE I

Ten grams Staybelite Ester No. 10 (partially hydrogenated rosin ester of glycerol), 2.22 grams benzil and 3.0 grams 4-methyl-7-dimethylaminocoumarin, dissolved in 1,000 milliliters Chlorothene (1,1,1-trichloroethane) was prepared and a portion was applied to the gelatin side of an 11 × 14 inches hardened gelatin coated paper by flowing the solution over the substrate supported at about a 60 ° angle with the horizontal. The remainder of the light-sensitive coating was placed in a stoppered bottle for later use. After air drying for approximately one minute, the light-sensitive layer was approximately 2.0 to 2.25 microns thick. The light-sensitive layer was placed in a vacuum frame in contact with a continuous tone transparency. After exposure to a mercury point light source for about 60 seconds, the exposed light-sensitive element was removed from the vacuum frame and developed in a room maintained at 75° F. and 37 percent relative humidity by rubbing a cotton pad containing approximately 5 grams of a 77 percent by weight Pliolite VTL (vinyltoluene-butadiene copolymer) and 23 percent Neo Spectra carbon black toner, prepared in the manner described below, across the element. The black developing powder wax embedded into the unexposed areas of the light-sensitive layer by rubbing the lightly compressed absorbent cotton pad about the size of a baseball weighing about 3 to 6 grams back and forth over the light-sensitive layer using essentially the same force used in ultrafine finishing of wood surface by hand sanding or steel wooling. The excess powder was removed from the light-sensitive layer by impinging air at an angle of about 30° to the surface until the surface was substantially free of unembedded particles. The reproduction was then wiped with a fresh cotton pad resulting in excellent resolution and faithful reproduction of the transparencies. The scanning electron microscope showed that a monolayer of particles was embedded in the image areas. The developed reproduction was then placed in a chamber containing trichloroethylene vapors maintained at room temperature for about 5 seconds to fuse the powder particles to the light-sensitive layer.

The black developing powder used in this example and employed for determining the $R_d$ of light-sensitive layers was prepared by heating a mixture of about 77 percent by weight Pliolite VTL (vinyltoluene-butadiene copolymer) and 23 percent by weight Neo Spectra carbon black to 350° F. to produce a pliable mixture, mixing on a rubber mill for 15 minutes, cooling to room temperature, and then grinding in a Mikro-atomizer. Over 99 percent by weight of the particles in the toner were between about 2 to 40 microns as measured by a Coulter Counter. Approximately 28 percent by weight of the powder particles were from about 2 to 10 microns with an additional 22 percent by weight from 10 to 15 microns.

The process described above was repeated using the original coating composition every month for six months with essentially the same results. This example clearly shows that the coating compositions of this invention are storage stable.

EXAMPLE II

This example illustrates how the concentration of benzil effects the $R_d$ of the Staybelite Ester No. 10 coating composition. Five coating compositions were prepared containing 100 ml. Chlorothene, 0.94 gram Staybelite Ester No. 10, .141 gram 4-methyl-7-dimethylaminocoumarin and (1) 0.085 gram benzil, (2) 0.122 gram benzil, (3) 0.160 gram benzil, (4) 0.197 gram benzil and (5) 0.235 gram benzil. Each of the solutions was flow coated on a gelatin coated substrate in the manner described in Example I and exposed for two minutes to actinic radiation through a Stouffer graduated continuous tone positive. Each of the exposed elements was developed with XEROX 914 black toner in the manner described in Example I and fused with trichloroethylene.

The $R_d$ of the 19th step was measured on a Densitometer, which is set forth below in Table 1.

Table 1

| Concentration Benzil | $R_d$ of Step 19 |
|---|---|
| 0.085 g. | 0.04 |
| 0.122 g | 0.28 |
| 0.16 g | 0.69 |
| 0.197 g | 0.87 |
| 0.235 g | 0.96 |

The above data clearly show the plasticizing effect of benzil.

EXAMPLE III

Five grams of the ethanol-insoluble fraction of soybean lecithin, 1.5 grams benzil and 0.05 gram 4-methyl-7-dimethylaminocoumarin, dissolved in 100 ml. C $Cl_4$, was flow coated over Lustercoat paper and air dried to form a 1.5 micron light-sensitive layer. The light-sensitive element was used to copy a translucent engineering drawing by passing the light-sensitive element through a Bruning Copyflex Model 250 at No. 10 setting equipped with a mercury lamp rated at 100 watts per inch. An excellent black and white copy was formed by embedding the Pliolite VTL-Neo Spectra carbon black toner described in Example I in the manner described in Example I.

EXAMPLE IV

Twenty grams of unfractionated, substantially oil-free soybean lecithin and 2 grams ferric chloride in 200 ml. carbon tetrachloride were mixed for 30 seconds with ultrasonic agitation, centrifuged, and 100 ml. decanted. A portion of the decanted liquid was flow coated on Lustercoat paper in the manner described in Example III. The light-sensitive element was used to copy a translucent engineering drawing by passing the light-sensitive element through the Bruning Copyflex copier at No. 40 setting. At this speed setting, exposure time was about one second. An excellent, slightly overexposed black and white copy was formed by embedding the Pliolite VTL-Neo Spectra carbon black toner in the manner described in Example III. The reproduction was slightly overexposed due to the limited speed of the copier, which was only designed to accommodate the use of commercial diazo products.

EXAMPLE V

This example illustrates that the thickness of flow coated light-sensitive layers of this invention can be controlled by controlling the solids in the light-sensitive coating since layer thickness increases as total solids in the coating composition increases.

Six hundred-twenty-five-one thousandths of a gram of Staybelite resin (partially hydrogenated rosin acids), 0.05 gram benzil, and 0.156 gram 4-methyl-7-dimethylaminocoumarin, dissolved in 100 ml. Chlorothene was applied to the gelatin side of hardened gelatin coated paper, to aluminum foil and to gelatin coated glass by flowing the solution over the substrate supported at about a 60° angle with the horizontal. The thickness of the light-sensitive coatings was determined by weight-difference (weighing the substrate before and after coating) or by sectioning the central portion of the coated light-sensitive element. The light-sensitive layer was 0.55 micron on gelatin coated glass by sectioning, 0.59 micron on gelatin coated glass by weight-difference, 0.65 micron on aluminum foil by weight-difference and 0.75 micron on the gelatin coated paper by sectioning.

One and one-quarter grams Staybelite resin, .1 gram benzil and 0.3125 gram 4-methyl-7-dimethylaminocoumarin, dissolved in 100 ml. Chlorothene was applied to aluminum foil in the above described manner and yielded a 2.25 micron light-sensitive layer by weight-difference. Two and one-half grams Staybelite resin, 0.2 gram benzil and 0.625 gram 4-methyl-7-dimethylaminocoumarin, dissolved in 100 ml. Chlorothene was flow coated on hardened gelatin coated paper yielding a 4.3 micron light-sensitive layer by sectioning.

Five grams Staybelite resin, 0.4 gram benzil and 1.25 grams 4-methyl-7-dimethylaminocoumarin, dissolved in 100 ml. Chlorothene was flow coated on aluminum foil and on steel foil. The light-sensitive layer was 6.25 microns by weight-difference on aluminum foil and 6.04 microns by sectioning on steel foil.

Each of the light-sensitive layers was exposed to light through a positive continuous-tone transparency and developed with the developing powder of Example I in the manner described therein to yield excellent positive continuous-tone images.

Example VI

One and one-fourth grams Staybelite Ester No. 5 (partially hydrogenated rosin ester of glycerol), 0.1875 gram benzil and 0.3125 gram 4-methyl-7-dimethylaminocoumarin, dissolved in 100 ml. Chlorothene was flow coated on the gelatin side of a hardened gelatin coated paper, exposed to a fluorescent lamp through a continuous-tone positive transparency and developed in the manner described in Example I to form an excellent continuous-tone positive reproduction.

EXAMPLE VII

One and one-fourth grams Staybelite resin F (partially hydrogenated rosin acids), 0.1 gram benzil and 0.3125 gram 4-methyl-7-dimethylaminocoumarin, dissolved in 100 ml. Chlorothene was flow coated on the gelatin side of hardened gelatin coated paper, exposed to a fluorescent lamp through a continuous-tone positive transparency and developed in the manner described in Example I to form an excellent continuous-tone positive reproduction.

EXAMPLE VIII

One and one-fourth grams wood rosin, 0.15 gram benzil and 0.3125 gram 4-methyl-7-dimethylaminocoumarin, dissolved in 100 ml. Chlorothene was flow coated on the gelatin side of hardened gelatin coated paper, exposed to a fluorescent lamp through a continuous-tone positive transparency and developed in the manner described in Example I to form an excellent continuous-tone positive reproduction.

EXAMPLE IX

One and one-fourth grams abietic acid, 0.15 gram benzil and 0.3125 gram 4-methyl-7-dimethylaminocoumarin, dissolved in 100 ml. Chlorothene was flow coated on the gelatin side of a hardened gelatin coated paper, exposed to a fluorescent lamp through a continuous-tone positive and developed in the manner described in Example I to yield an excellent continuous-tone positive reproduction.

EXAMPLE X

Eight-tenths gram Castorwax F-1 (hydrogenated castor oil), 0.2 gram benzil and 0.2 gram 4-methyl-7-dimethylaminocourmarin, dissolved in 100 ml. Chlorothene was flow coated on the gelatin side of a hardened gelatin coated paper. The light-sensitive layer was placed in a vacuum frame in contact with continuous-tone negatives and an 85-line-per-inch negative half-tone transparency. After exposure to a 100 amp carbon arc lamp for approximately 80 seconds, the exposed light-sensitive element was developed with the black developing powder in the manner described in Example I. The black developing powder embedded in the exposed areas in proportion to the amount of exposure with no embedment in the unexposed areas. The developed reproductions were then placed in a chamber containing trichloroethylene vapors maintained at room temperature for about 5 seconds to fuse the powder particles to the light-sensitive layer.

EXAMPLE XI

One and one-quarter gram Chlorowax 70 LMP, 0.3 gram benzil and 0.3125 gram 4-methyl-7-dimethylaminocoumarin, dissolved in 100 ml. Chlorothene was flow coated on the gelatin side of a hardened gelatin coated paper, exposed to light through a continuous-tone positive transparency and developed in the manner described in Example I with the Pliolite VTL-Neo Spectra carbon black toner to form an excellent continuous-tone positive reproduction. This sensitizer system is roughly equivalent to various rosin esters, acids and hydrogenated rosin acids and esters.

EXAMPLE XII

Five grams of Piccotex (alpha-methyl styrene-vinyltoluene copolymer having a ball and ring softening print of 75° C.) and one gram benzil, dissolved in 100 ml. Chlorothene was flow coated on a grained aluminum plate. The light-sensitive layer was placed in a vacuum frame in contact with a continuous-tone positive transparency, an 85-line-per-inch positive half-tone transparency and positive line transparency. After exposure for 10 minutes to a 100 ampere arc lamp at a distance of 48 inches, the light-sensitive element was developed with the Pliolite VTL-carbon black toner in the manner described in Example I to form positive continuous, half-tone and line reproductions. The light source was maintained at 48 inches in order to avoid heating the light-sensitive layer which tends to become too tacky when warmed slightly.

EXAMPLE XIII

Seven grams Cumar VI (para-coumarone-indene resin), 3 grams Hercolyn D (hydrogenated methyl ester of rosin), 3 grams benzil and 1 gram 4-methyl-7-dimethylaminocoumarin in 100 ml. Chlorothene were flow coated on a grained aluminum plate. The light-sensitive layer was placed in contact with a continuous-tone positive transparency. After exposure to a sunlamp for about 5 minutes, the exposed light-sensitive element was developed in the manner described in Example I to form a continuous-tone positive image.

EXAMPLE XIV

A coating solution was prepared according to Example I of U. S. Pat. No. 3,060,024 using 15 grams polyethylene terephthalate/sebacate (prepared from 0.12 mole dimethyl terephthalate and 0.06 mole dimethyl sebacate), 2.7 grams tetraethylene glycol diacrylate, 0.003 gram phenanthraquinone, .003 gram p-methoxyphenol, 1.5 grams benzil, and 0.01 gram 4-methyl-7-dimethylaminocoumarin in 83.3 cc. dichloromethane and flow coated on grained aluminum and air dried. A coated aluminum sheet was exposed for 15 minutes to a sunlamp through a continuous-tone positive transparency and developed with titanium dioxide at room temperature in the manner described in Example I yielding a continuous tone reproduction.

EXAMPLE XV

Five grams polyethylmethacrylate and 2.5 grams benzoin, dissolved in 350 ml. methylethyl ketone was flow coated on gelatin coated paper, exposed to light through a metal mask for 20 seconds and developed in the manner described in Example I using XEROX 914 Toner to form a positive image.

EXAMPLE XVI

Five grams poly (n-butylmethacrylate) and 5 grams benzoin, dissolved in 690 ml. methylethyl ketone was flow coated on gelatin coated paper, exposed to light through a metal mask for 20 seconds and developed in the manner described in Example I using XEROX 914 Toner to form a negative image.

When this example was repeated using 5 grams poly n-butylmethacrylate and 2.5 grams benzoin dissolved in 375 ml. methylethyl ketone, a positive image was formed.

EXAMPLE XVII

This example illustrates the relationship between the thickness of the light-sensitive layer and solids in the coating composition. A series of lecithin solutions comprising from 0.5 gram to 50 grams of substantially oil-free soybean lecithin in 100 ml. of Chlorothene were flow coated on glass and air dried. The layer thickness was determined by sectioning the glass coated with solutions containing at least 5 grams lecithin and extrapolating the thickness of solutions containing less than 5 grams lecithin. The data is set forth below in Table 2.

Table 2

| Grams Lecithin in 100 ml. Chlorothene | Film Thickness in Microns |
|---|---|
| 0.5 | 1/8 |
| 1.0 | 1/4 − |
| 2.0 | 1/4 + |
| 5.0 | 1 + |
| 10.0 | 2 + |
| 20.0 | 5 to 6 |
| 30.0 | 10 to 12 |
| 40.0 | 20 to 22 |
| 50.0 | 26 to 30 |

EXAMPLE XVIII

This example illustrates the screening of a number of free radical progenitors as photoactivators for light-sensitive lecithin composition. Five grams of the ethanol insoluble residue of soybean lecithin and from 0.1 to 0.2 grams of free radical progenitor, dissolved in 100 ml. carbon tetrachloride were flow coated on Lustercoat paper in the manner described in Example III. A metal mask was positioned over the light-sensitive element and individual areas were exposed to 1, 2, 4, and 8 minutes. The results are set forth below in Table 3. The photoactivators rated A had a pronounced effect on the light-sensitivity of the lecithin layer. Those ranked B made a definite improvement, although not nearly as much under the conditions of evaluation as those rated A. Many of the materials rated C had some effect on light-sensitivity but were considerably less effective than those rating A and B.

Table 3

| Sensitizer | Rating | |
|---|---|---|
| Benzil | A | |
| Benzoin | A | |
| Michlers ketone | A | |
| Diacetyl | A | |
| Phenanthraquinone | A | |
| p-dimethylaminobenzoin | A | |
| 7-8-benzoflavone | A | |
| Nitroisatin | A | |
| Di(6-dimethylamino-e-pyradil) methane | A | |
| Trinitrofluorenone | A | |
| Metal napthanates | B | |
| Dimethylaniline | B | |
| Desoxy benzoin | B | |
| 2,3-pentanedione | B | |
| Chlorophyll in oil | B | Dibenzylketone |
| N-methyl-N-phenylbenzylamine | B | |
| Pyridil | B | |
| 5-7 dichloroisatin | B | |
| Azodiisobutyronitrile | B | |
| Tripiridyl-S-triazine | B | |
| Trinitroanisole | B | |
| Oil soluble chlorophyll | B | |
| Isatin | B | |
| Bromoisatin | B | |
| Chloranil | C | |
| 2(p-Iodophenyl)-3 (p-nitrophenyl)-5-tetrazolium chloride | C | |
| p-nitrobenzene diazoniumfluoborate | C | |
| Trans 1,2 dibenzylethylene | C | |
| Tertiary butylhydroperoxide | C | |
| Benzoinoxime | C | |
| Ninhydrin | C | |
| 5-methylisatin | C | |
| Benzyhydrol | C | |
| N-benzylideneaniline | C | Tetrazolium violet |
| p-tolyltetrazolium chloride | C | |
| TPTC Formazan | C | |
| E-tolyl TC Formazan | C | |
| Hexanitra-diphenylamine | C | |
| Dithiobis-2(2-nitrobenzoic acid) | C | |
| Tetraphenyl-boron sodium | C | |
| 4-hydroxy-2 butanone | C | |
| N-benzylpeperidinum methiodide | C | |
| Anthracene | C | |
| N,N-dimethylaniline | C | |
| Iron dicyclopentadienyl | C | |
| Lead tetraacetate | C | |
| Glyoxal | C | |

Since many embodiments of this invention may be made and since many changes may be made in the embodiments described, the foregoing is interpreted as illustrative and the invention is defined by the claims appended hereafter.

What is claimed is:

1. A storage stable coating composition suitable for the preparation of a solid, positive-acting, light-sensitive organic layer capable of developing a $R_{dp}$ of 0.2 to 2.2 at room temperature by physically embedding a monolayer of powder particles comprising a liquid vehicle, a film-forming organic material containing no conjugated terminal ethylenic unsaturation and a photoactivator capable of producing free radicals, wherein said film-forming organic material is present in a concentration of from 0.1 to 50 grams per 100 ml. of liquid vehicle and said photoactivator comprises at least 5 parts by weight per each 100 parts by weight film-forming organic material.

2. The composition of claim 1, wherein said coating composition is suitable for the preparation of a positive-acting solid, light-sensitive organic layer capable of developing a $R_{dp}$ of at least 0.4 at room temperature.

3. The composition of claim 2, wherein said film forming organic material comprises an internally ethylenically unsaturated acid.

4. The composition of claim 3, wherein said film forming organic material comprises a partially hydrogenated rosin acid.

5. The composition of claim 2, wherein said film forming organic material comprises an ester of an internally ethylenically unsaturated acid.

6. The composition of claim 5, wherein said ester comprises a partially hydrogenated rosin ester.

7. The composition of claim 5, wherein said ester comprises a phosphatide.

8. The composition of claim 2, wherein said film forming organic material comprises a polymer of an ethylenically unsaturated monomer.

9. The composition of claim 2, wherein said film forming organic material comprises a coal tar resin.

10. The composition of claim 2, wherein said film forming organic material comprises a halogenated hydrocarbon.

11. A storage stable coating composition suitable for the preparation of a solid, positive-acting, light-sensitive organic layer capable of developing a $R_{dp}$ of 0.2 to 2.2 at room temperature by physically embedding a monolayer of powder particles comprising a liquid vehicle, a film-forming organic material containing no conjugated terminal ethylenic unsaturation and a photoactivator capable of producing free radicals selected from the group consisting of acyloins and vicinal diketones, wherein said film-forming organic material is present in a concentration of from 0.1 to 50 grams per 100 ml. of liquid vehicle and said photoactivator comprises at least 5 parts by weight per each 100 parts by weight film-forming organic material.

12. The composition of claim 11, wherein said film forming organic material comprises an internally ethylenically unsaturated acid.

13. The composition of claim 12, wherein said film forming organic material comprises a partially hydrogenated rosin acid.

14. The composition of claim 11, wherein said film forming organic material comprises an ester of an internally ethylenically unsaturated acid.

15. The composition of claim 14, wherein said ester comprises a partially hydrogenated rosin ester.

16. The composition of claim 14, wherein said ester comprises a phosphatide.

17. The composition of claim 11, wherein said film forming organic material comprises a polymer of an ethylenically unsaturated monomer.

18. The composition of claim 11, wherein said film forming organic material comprises a coal tar resin.

19. The composition of claim 11, wherein said film forming organic material comprises a halogenated hydrocarbon.

20. A storage stable coating composition suitable for the preparation of a solid, positive-acting, light-sensitive organic layer capable of developing a $R_{dp}$ of 0.2 to 2.2 by physically embedding a monolayer of powder particles comprising a film-forming organic material containing no conjugated terminal ethylenic unsaturation, a photoactivator capable of producing free radicals and a liquid vehicle selected from the group consisting of hydrocarbons and halohydrocarbons, wherein said film-forming organic material is present in a concentration of 0.1 to 50 grams per 100 ml. of liquid vehicle and said photoactivator comprises at least 5 parts by weight per each 100 parts by weight film-forming organic material.

21. The composition of claim 20, wherein said solid, light-sensitive organic layer is positive-acting, said photoactivator is selected from the group consisting of acyloins and vicinal diketones and said photoactivator is present in a plasticizing concentration sufficient to provide a light-sensitive organic layer capable of developing a $R_{dp}$ of at least 0.4 at room temperature.

22. The composition of claim 21, wherein said photoactivator comprises benzil.

23. The composition of claim 21, wherein said photoactivator comprises benzoin.

24. The composition of claim 20, wherein said liquid vehicle comprises 1,1,1-trichloroethane.

25. The composition of claim 20, wherein said solid, film forming organic material comprises an internally ethylenically unsaturated acid.

26. The composition of claim 25, wherein said film forming organic material comprises a partially hydrogenated rosin acid in a concentration of about 0.4 to 3 grams per 100 ml. of vehicle.

27. The composition of claim 20, wherein said solid film forming organic material comprises an ester of an internally ethylenically unsaturated acid.

28. The composition of claim 27, wherein said ester comprises a partially hydrogenated rosin ester in a concentration of about 0.4 to 3 grams per 100 ml. of liquid vehicle.

29. The composition of claim 27, wherein said ester comprises a phosphatide in a concentration of about 2 to 20 grams per 100 ml. of vehicle.

30. The composition of claim 29, wherein said photoactivator comprises ferric chloride.

31. The composition of claim 21, wherein said composition comprises an aminocoumarin superphotoactivator.

32. A storage stable coating composition suitable for the preparation of a solid, positive-acting, light-sensitive organic layer capable of developing a $R_{dp}$ of 0.4 to 2.2 at room temperature by physically embedding a monolayer of powder particles comprising 1,1,1-trichloroethane, a photoactivator capable of producing free radicals and a film-forming organic material selected from the group consisting of rosin acids, hydrogenated rosin acids, rosin acid esters and hydrogenated rosin acid esters, wherein said film-forming organic material comprises from about 0.4 to 3 grams per 100 ml. of 1,1,1-trichloroethane and said photoactivator comprises at least 5 parts by weight per each 100 parts by weight film-forming organic material.

33. The composition of claim 32, wherein said photoactivator comprises benzil.

34. The composition of claim 32, wherein said composition comprises an aminocoumarin superphotoactivator.

35. The composition of claim 32, wherein said photoactivator comprises a member of the group consisting of acyloins and vicinal diketones.

* * * * *

UNITED STATES PATENT OFFICE
CERTIFICATE OF CORRECTION

Patent No. 3,713,831 Dated January 30, 1973

Inventor(s) Lester P. Hayes; Rexford W. Jones and William B. Thompson

It is certified that error appears in the above-identified patent and that said Letters Patent are hereby corrected as shown below:

In the heading:

For "Rexford W. Jones of Decatur, Ill.", read ---Rexford W. Jones of Columbus, Ohio Column 1, bridging lines 40-41, for "-mechnically embedded" read ---"mechanically embedded".

Column 3, line 48; for "acting solid" read ---acting, solid---.

Column 4, bridging lines 24-25, for "1967, now abandoned" read ---1967, now U. S. Patent 3,471,466,---.

Column 4, line 30, for "diliolenyl" read ---cilinolenyl---.

Column 5, line 37, for "pyradil" read ---pyridyl---.

Column 5, line 37, for "napthanates" read ---naphthenates---.

Column 5, line 38, for "pyridil" read ---pyradil---

Column 5, line 44, for "concentrations" read ---concentration---.

Column 6, line 20, for "Aniline" read ---aniline---.

Column 6, line 23, for "Eosine" read ---eosine---.

Column 6, line 25, for "Anthracene" read ---anthracene---.

Column 6, line 26, for "Acid" read ---acid---.

Column 6, line 27, for "OR" read ---Or---.

Column 6, line 28, for "Resoflorm" read ---Resoform---.

Column 6, line 29, for "Eosin" read ---eosine---.

Column 6, line 29, for "Thiazole fluorescor G" read ---thiazole fluorescor G---.

Column 6, line 30, for "Pyrazalone organe" read ---pyrazolone orange---.

Column 7, line 43, for "unsaturation, are" read ---unsaturation and are---.

Column 7, line 54, for "non-flammable, low cost" read ---non-flammable and low cost---.

Column 8, line 28, for "wax" read ---was---.

Column 8, line 31, for "baseball weighing" read ---baseball and weighing---.

Column 8, line 45, for "vapors maintained" read ---vapors and maintained---.

Column 9, line 38, for "C $Cl_4$" read ---$CCl_4$---.

FORM PO-1050 (10-69)

USCOMM-DC 60376-P69

★ U.S. GOVERNMENT PRINTING OFFICE : 1969 O—366-334.

UNITED STATES PATENT OFFICE
CERTIFICATE OF CORRECTION

Patent No. 3,713,831 Dated January 30, 1973

Inventor(s) Lester P. Hayes; Rexford W. Jones and William B. Thompson

It is certified that error appears in the above-identified patent and that said Letters Patent are hereby corrected as shown below:

PAGE 2

Column 10, line 8, for "five-one thousandths" read ---five thousandths---.
Column 11, line 44, for "vapors maintained" read ---vapors and maintained---.
Column 11, line 67, for "print" read ---point---.
Column 13, line 50, for "pyradil" read ---pyridyl---.
Column 13, line 52, for "napthanates" read ---naphthenates---.
Column 13, line 54, for "Chlorophyll in Oil B Dibenzylketone" read ---Chlorophyll in Oil B---, next line read ---Dibenzylketone B---.
Column 13, line 59, for "Tripiridyl" read ---Tripyridyl---.
Column 14, line 1, for "Benzyhydrol" read ---Benzhydrol---.
Column 14, line 2, for "n-benzylideneaniline C Tetrazolium violet" read ---N-benzylidene aniline C---, next line read ---Tetrazolium violet C---.
Column 14, line 8, for "N-benzylpeperidinum" read ---N-benzyl piperidinium---.

Signed and sealed this 24th day of September 1974.

(SEAL)
Attest:

McCOY M. GIBSON JR.
Attesting Officer

C. MARSHALL DANN
Commissioner of Patents

FORM PO-1050 (10-69)

USCOMM-DC 60376-P69
★ U.S. GOVERNMENT PRINTING OFFICE : 1969 O—366-334.